United States Patent
Kong et al.

(10) Patent No.: US 9,893,878 B1
(45) Date of Patent: Feb. 13, 2018

(54) ON-CHIP JITTER MEASUREMENT FOR CLOCK CIRCUITS

(71) Applicant: Oracle International Corporation, Redwood City, CA (US)

(72) Inventors: Long Kong, Santa Clara, CA (US); Ben Li Chen, San Jose, CA (US); Philip Kwan, San Francisco, CA (US); Zuxu Qin, Stanford, CA (US); Dawei Huang, San Diego, CA (US)

(73) Assignee: ORACLE INTERNATIONAL CORPORATION, Redwood City, CA (US)

( * ) Notice: Subject to any disclaimer, the term of this patent is extended or adjusted under 35 U.S.C. 154(b) by 0 days.

(21) Appl. No.: 15/459,715

(22) Filed: Mar. 15, 2017

(51) Int. Cl.
  *H04L 27/152* (2006.01)
  *H04L 7/033* (2006.01)
  *H03L 7/089* (2006.01)
  *H03L 7/099* (2006.01)
  *H03L 7/081* (2006.01)
  *H04L 7/00* (2006.01)

(52) U.S. Cl.
  CPC .......... *H04L 7/0331* (2013.01); *H03L 7/0814* (2013.01); *H03L 7/0891* (2013.01); *H03L 7/0991* (2013.01); *H04L 7/0037* (2013.01)

(58) Field of Classification Search
  CPC ... H04L 7/0331; H04L 7/0037; H03L 7/0814; H03L 7/0891; H03L 7/0991
  See application file for complete search history.

(56) References Cited

U.S. PATENT DOCUMENTS

| | | | | |
|---|---|---|---|---|
| 8,594,264 B1* | 11/2013 | Zhu | ............ | H03L 7/085 327/149 |
| 2003/0223526 A1* | 12/2003 | Sorna | ............ | G01R 31/31709 375/376 |
| 2005/0028019 A1* | 2/2005 | Kim | ............ | G11C 7/22 713/500 |
| 2007/0080728 A1* | 4/2007 | Iwata | ............ | H03L 7/07 327/156 |
| 2009/0039867 A1* | 2/2009 | Saint-Laurent | ....... | G04F 10/005 324/102 |
| 2012/0098571 A1* | 4/2012 | Feist | ............ | G01R 31/31708 327/10 |
| 2017/0237444 A1* | 8/2017 | Wei | ............ | H03L 7/0814 327/156 |

* cited by examiner

*Primary Examiner* — Syed Haider
(74) *Attorney, Agent, or Firm* — Marsh Fischmann & Breyfogle LLP; Daniel J. Sherwinter; Kent A. Lembke

(57) ABSTRACT

Embodiments include systems and methods for on-chip random jitter (RJ) measurement in a clocking circuit (e.g., in a phase-locked loop of a serializer/deserializer circuit). Some embodiments determine a reference delay code sweep window to capture at least a candidate RJ range of a feedback clock signal, the reference delay code sweep window comprising a sequence of reference delay codes. A distribution of one-scores can be computed over the reference delay code sweep window, so that the distribution indicates a relatively likelihood, for each reference delay code, of obtaining a '1' sample when sampling the feedback clock signal according to the delayed clock signal (delayed by an amount according to the reference delay code). The distribution can be transformed into a time domain by computing code offset times for the reference delay codes. A RJ output can be computed as a function of the distribution in the time domain.

20 Claims, 11 Drawing Sheets

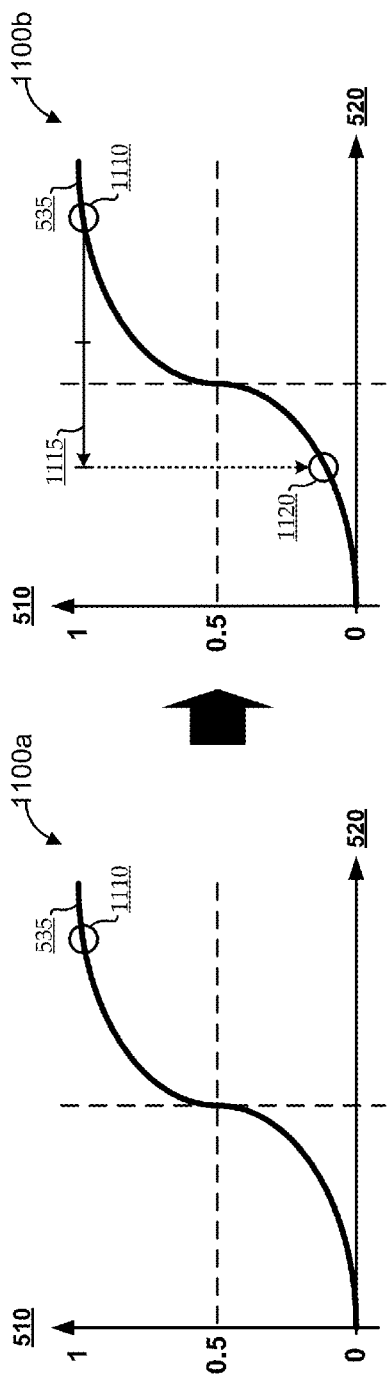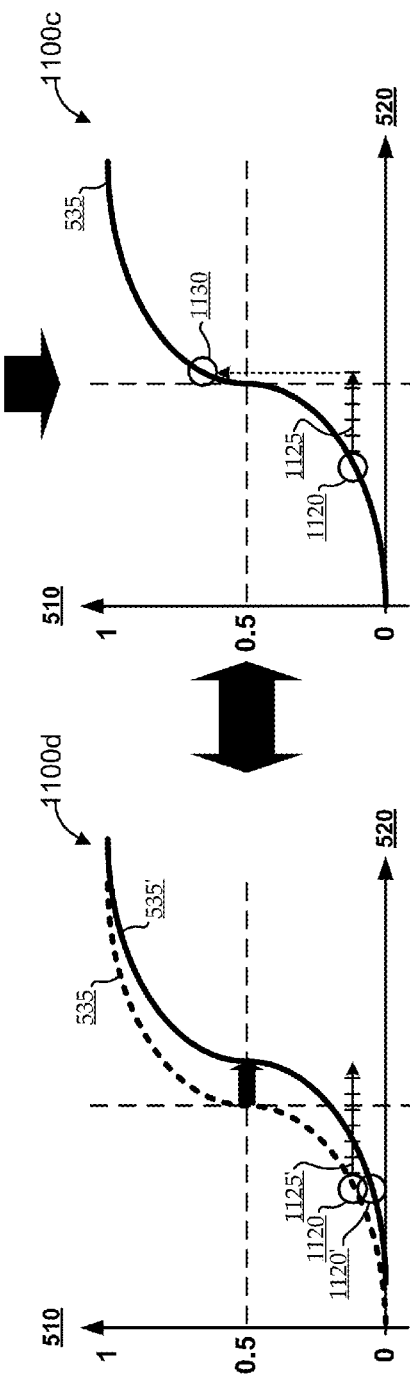

ON-CHIP JITTER MEASUREMENT FOR CLOCK CIRCUITS

FIELD

Embodiments relate generally to clocking circuits, and, more particularly, to techniques for on-chip jitter measurement in clocking circuits, such as in a phase-locked loop (PLL) circuit in a serializer/deserializer (SERDES).

BACKGROUND

Many integrated circuits have signal lanes that support transmission and/or receipt of data signals. Those signal lanes can include circuitry (e.g., serializer/deserializer, or SERDES, circuits) to prepare bit data for transmission and/or to recover bit data after receipt. Noise sources and other non-idealities can produce random jitter (RJ) on clocking signals (e.g., on the output of the phase-locked loop (PLL)). For high-speed SERDES links, RJ on the PLL output can appreciably affect the link performance. Typically, the RJ seen in a SERDES link is directly affected by loop parameters (e.g., charge pump current, voltage controlled oscillator gain, supply voltage, etc.), and the performance can vary appreciably due to different process characteristics, voltages, temperatures, and/or other characteristics, even with the same loop parameter settings. Performance impacts can be further exacerbated when a single chip contains many lanes, each adding to process variations and ultimately degrading yield. For example, some modern processors include hundreds of lanes with tens of PLLs. Conventional approaches to addressing RJ in high-speed SERDES links tend to focus on designing high-accuracy PLLs across different corners, but such approaches can involve tremendous effort and can become impractical as the link speed and number of lanes increase.

BRIEF SUMMARY

Among other things, embodiments provide novel systems and methods for on-chip random jitter (RJ) measurement in a clocking circuit (e.g., in a phase-locked loop of a serializer/deserializer circuit). Some embodiments determine a reference delay code sweep window to capture at least a candidate RJ range of a feedback clock signal, the reference delay code sweep window comprising a sequence of reference delay codes. A distribution of one-scores can be computed over the reference delay code sweep window, so that the distribution indicates a relatively likelihood, for each reference delay code, of obtaining a '1' sample when sampling the feedback clock signal according to the delayed clock signal (delayed by an amount according to the reference delay code). The distribution can be transformed into a time domain by computing code offset times for the reference delay codes. A RJ output can be computed as a function of the distribution in the time domain. Some embodiments can compute such an RJ output for each of a number of sets of PLL parameters to identify a set of PLL parameters that yields a lowest RJ output; and the PLL can be configured according to the identified set of parameters. Further, some embodiments can identify such a PLL configuration for some or all of a number of PLLs on a processor.

BRIEF DESCRIPTION OF THE DRAWINGS

The present disclosure is described in conjunction with the appended figures:

FIGS. 11A-11D shows an illustrative graphical representation of the method of FIG. 10;

Figure 1:
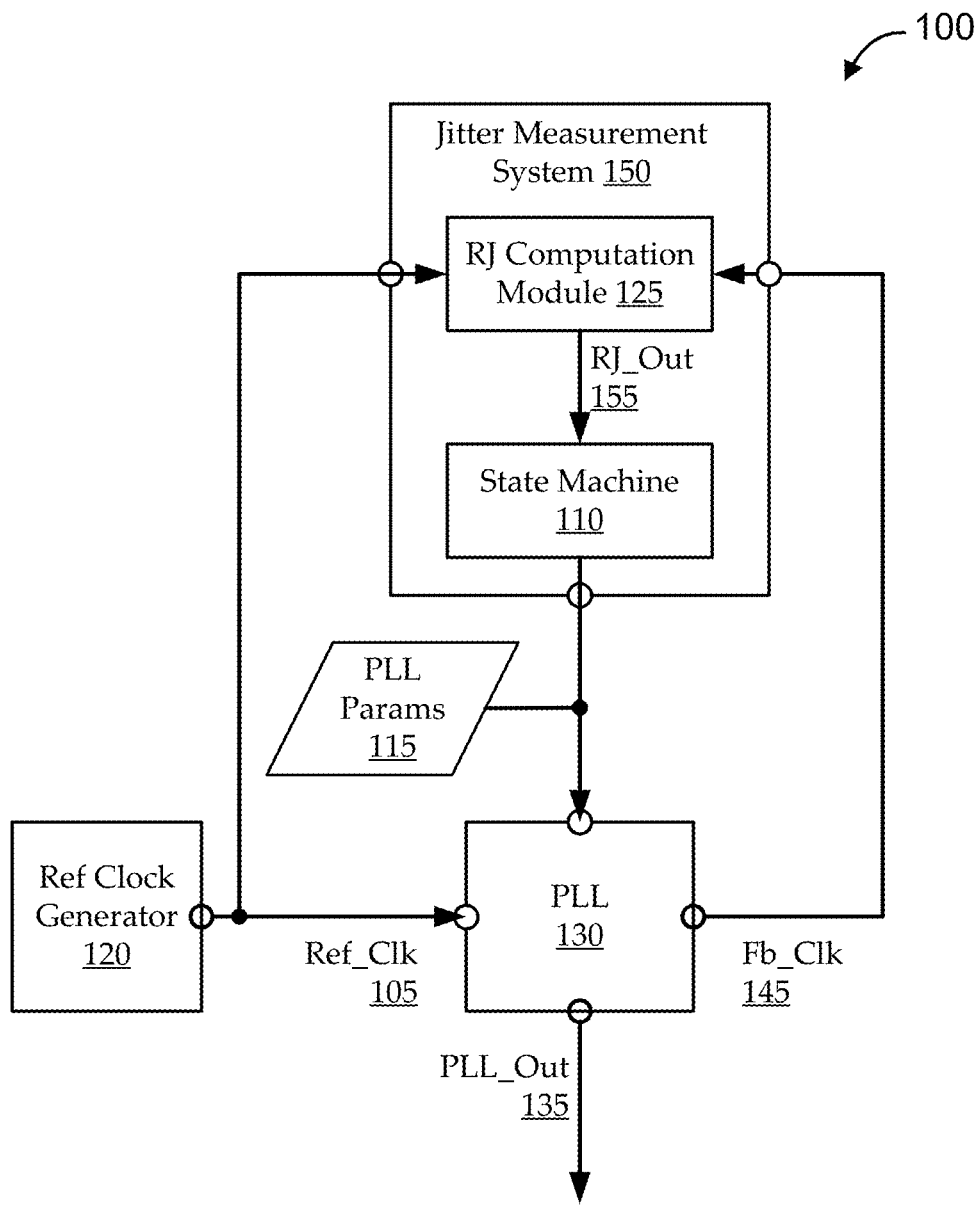
FIG. 1 shows a block diagram of an illustrative clock generation environment, as a context for various embodiments.

In the appended figures, similar components and/or features may have the same reference label. Further, various components of the same type may be distinguished by following the reference label by a second label that distinguishes among the similar components. If only the first reference label is used in the specification, the description is applicable to any one of the similar components having the same first reference label irrespective of the second reference label.

DETAILED DESCRIPTION

Random jitter (RJ) is typically inherent in serializer/deserializer (SERDES) circuits, particularly on clock outputs (e.g., phase-locked loop, or PLL, outputs). The RJ can appreciably affect the link performance. Typically, the RJ seen in a SERDES link is directly affected by loop parameters (e.g., charge pump current, voltage controlled oscillator gain, supply voltage, etc.), and the performance can vary appreciably due to different process characteristics, voltages, temperatures, and/or other characteristics, even with the same loop parameter settings. Performance impacts can be further exacerbated when a single chip contains many lanes, each adding to process variations and ultimately degrading yield. For example, some modern processors include hundreds of lanes with tens of PLLs.

Traditionally, there has not been a good way to measure RJ of a PLL during system operation, particularly in context of high-speed serial links. One reason is that the RJ changes with temperature, supply voltage, and/or other environmental factors and/or components coupled with the PLL in a particular application, such that any RJ measurement in a laboratory testing environment may not accurately represent the RJ of the PLL when in its deployed operating environment. Another reason is that meaningful measurement of RJ in a high speed link can rely on sub-femtosecond measurement accuracy, which has traditionally been impractical. As such, conventional approaches to addressing RJ in high-speed SERDES links tend to focus on designing high-accuracy PLLs across different corners, in an attempt to ensure operation even with large amounts of RJ. While such approaches can be effective, they tend to involve tremendous effort and cost and can become impractical as the link speed and number of lanes increase.

Embodiments described herein include novel techniques for implementing on-chip jitter measurement in clocking circuits, such as in the PLLs of SERDES circuits. For a selected set of PLL circuit parameters, embodiments can compute a distribution indicating a probability that a reference clock and a PLL feedback clock will concurrently be asserted over each of a number of relative delay amounts between the clocks. The distribution can be used to compute an estimated RJ for the PLL (with the selected PLL parameters). For example, the RJ can be assumed to substantially follow a Gaussian distribution, and the RJ can be estimated as one standard deviation (a) from the mean of the computed distribution. Some embodiments can compute an estimated RJ for each of a number of different PLL parameter sets and can identify the set of PLL parameters that results in a lowest estimated RJ. Some embodiments can set the PLL parameters according to the identified minimum RJ for that PLL. In some implementations, such a technique can be performed for each of multiple PLLs on a processor.

In the following description, numerous specific details are set forth to provide a thorough understanding of the present invention. However, one having ordinary skill in the art should recognize that the invention may be practiced without these specific details. In some instances, circuits, structures, and techniques have not been shown in detail to avoid obscuring the present invention.

FIG. 1 shows a block diagram of an illustrative clock generation environment 100, as a context for various embodiments. The clock generation environment 100 can be within a larger context of larger circuit context, such as part of, or coupled with a serializer/deserializer (SERDES) circuit, a microprocessor, etc. As illustrated, the clock generation environment 100 can include a jitter measurement system 150 coupled with a phase-locked loop (PLL) module 130, and a reference clock generator module 120. While embodiments are described herein in relation to clocks generated with a PLL, techniques described herein can be implemented in any suitable clocking or other environment experiencing random jitter (RJ). Further, functionality described with reference to particular blocks can be performed by any suitable block, and/or blocks can be separated or combined in alternative implementations.

In general, the PLL module 130 receives a reference clock signal 105 from the reference clock generator module 120 and outputs a PLL output signal 135, which is a relatively stable clock signal at a particular frequency. To maintain a level of stability in the frequency of the PLL output signal 135, the PLL module 130 typically includes a feedback loop. Internal to the PLL module 130, feedback loop can generate a feedback clock signal 145 from the PLL output signal 135, and the feedback clock signal 145 can be fed back to an input of the PLL module 130. For example, the PLL feedback loop can include a frequency divider circuit, or the like, that facilitates stabilization of the PLL output signal 135 by comparing the reference clock signal 105 and the feedback clock signal 145. As described above, it is typical for the PLL output signal 135 to manifest random jitter (RJ), for example, from power supply noise and/or other environmental non-idealities. As RJ increases, the PLL output signal 135 can become less consistent, and performance of circuits relying on the PLL output signal 135 (e.g., SERDES components clocked according to the PLL output signal 135) can be negatively impacted.

As RJ increases, the PLL output signal 135 can become less consistent, and performance of circuits relying on the PLL output signal 135 (e.g., SERDES components clocked according to the PLL output signal 135) can be negatively impacted. Accordingly, it can be desirable to measure the RJ of the PLL output signal 135. In some cases, such a measurement can be useful in diagnosis of performance issues (e.g., SERDES errors), which may be resulting from too much RJ on the PLL output signal 135. In other cases, such a measurement can be used to find PLL parameters 115 (electrical parameter settings for components of the PLL module 130) that will result in a reduced (e.g., a lowest) amount of RJ. The RJ can largely result from interactions between environmental non-idealities and components of the PLL module 130, such that PLL parameter 115 settings (values of electrical parameters of those components, such as voltages, currents, capacitance, resistance, etc.) can affect the amount and type of resulting RJ. For example, adjusting charge pump current and/or voltage-controlled oscillator (VCO) gain can increase or reduce the amount of RJ manifest on the PLL output signal 135.

Embodiments include a jitter measurement system 150 that seeks to compute an estimate of the RJ present on the PLL output signal 135. The jitter measurement system 150 can include a RJ computation module 125 that receives the reference clock signal 105 and the feedback clock signal 145, and generates a RJ output signal 155, as described more fully below. Some embodiments of the jitter measurement system 150 can iterate through various settings for the PLL parameters 115, each time receiving an estimate of the resulting RJ (via the RJ output signal 155), and can seek to identify settings for the PLL parameters 115 that manifest a reduced (e.g., lowest) RJ. For example, the jitter measurement system 150 can include a state machine 110 that adjusts the PLL parameters 115 according to a predetermined routine, and monitors the RJ output signal 155 to find a minimum amount of RJ.

Figure 2:
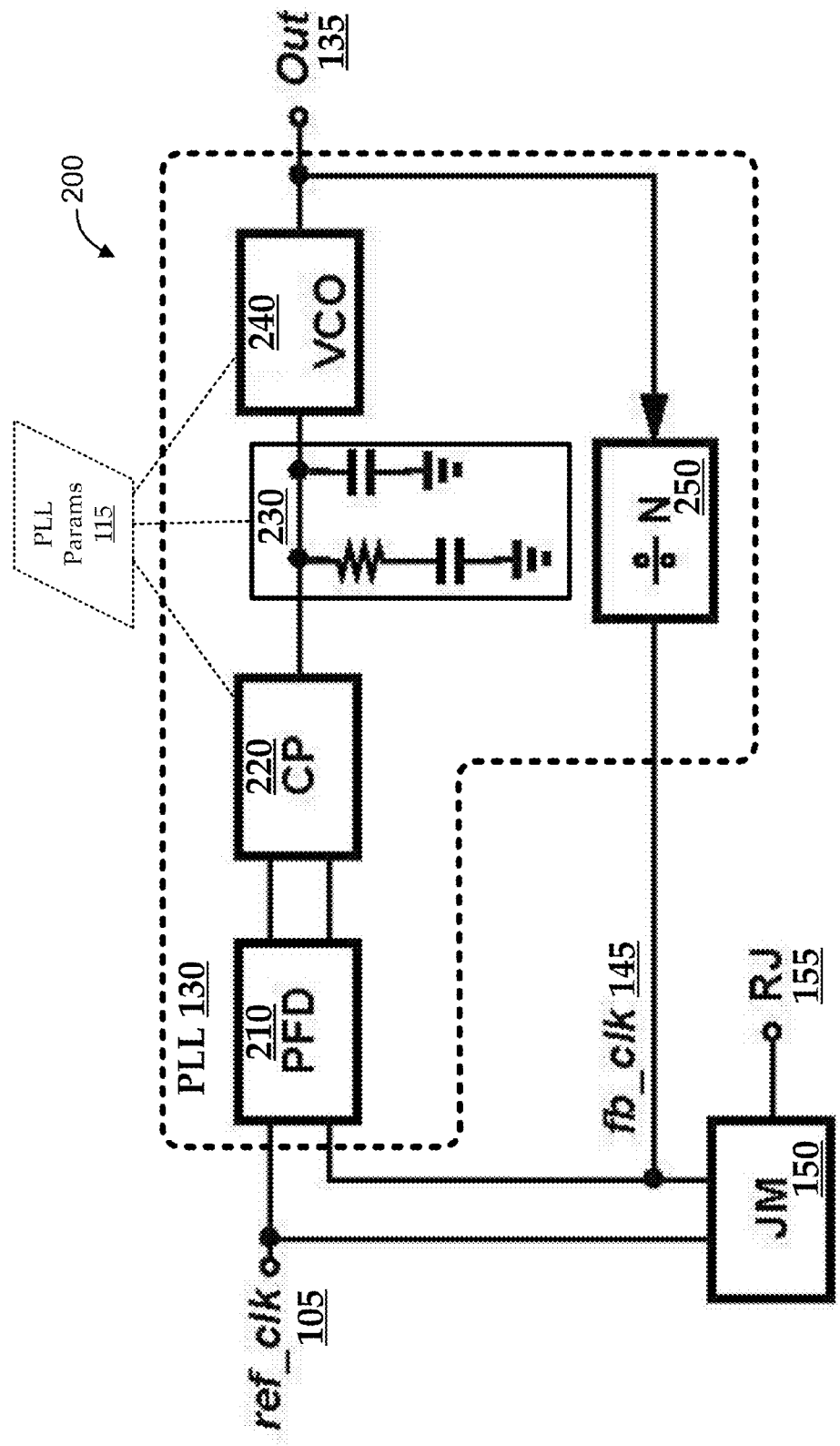
FIG. 2 shows another illustrative clocking environment as further context for various embodiments.

FIG. 2 shows another illustrative clocking environment 200 as further context for various embodiments. As in FIG. 1, the clocking environment 200 of FIG. 2 includes a PLL module 130 and a jitter measurement system 150. The illustrated PLL module 130 includes a phase frequency detector (PFD) 210, a charge pump 220, a low-pass filter 230, a ring voltage-controlled oscillator (VCO) 240, and a frequency divider 250. In general, the PLL module 130 generates a PLL output signal 135 from a reference clock signal 105, and stabilizes the PLL output signal 135 using a feedback loop. The PFD 210 receives a reference clock signal 105 (e.g., from the reference clock generator module 120 shown in FIG. 1) and a feedback clock signal 145 generated from the PLL output signal 135 and compares the phases of the received signals. The output of the PFD 210 is passed to the charge pump 220, low-pass filter 230, and ring VCO 240, which amplify, filter, modulate, and/or otherwise convert the output of the PFD 210 into a PLL output signal 135 having a desired frequency and gain. The PLL output signal 135 can be fed back to the frequency divider 250, which can down-convert the PLL output signal 135 to a frequency appropriate for feedback to the input of the PFD 210.

Generally, RJ on the PLL output signal 135 comes from PLL parameters 115 relating to the charge pump 220 (e.g., charge pump current), low-pass filter 230 (e.g., capacitance and/or resistance, and thereby frequency response), and ring VCO 240 (e.g., VCO gain). The frequency divider 250 typically does not add any appreciable RJ to the PLL output signal 135. As such, it can generally be assumed that any RJ on the PLL output signal 135 can be analogously measured from the feedback clock signal 145. For example, the RJ on the PLL output signal 135 can be described by:

$$RJ_{out} = \frac{\sqrt{\int S_{\Phi,out}(f)df}}{2\pi} T_{out}.$$

Similarly, the RJ on the feedback clock signal 145 can be described by:

$$RJ_{fb} = \frac{\sqrt{\int S_{\Phi,fb}(f)df}}{2\pi} T_{fb}.$$

As illustrated, implementations are described herein assuming that the jitter measurement system 150 uses the reference clock signal 105 and the feedback clock signal 145 to compute an estimate of RJ and to generate a RJ output signal 155. In alternative implementations, the jitter measurement system 150 can use the PLL output signal 135 directly, or any other suitable signal. However, down-conversion of the feedback clock signal 145 to the frequency of the reference clock signal 105 by the frequency divider 250 permits its use without further adaptation or adjustment.

Figure 5:
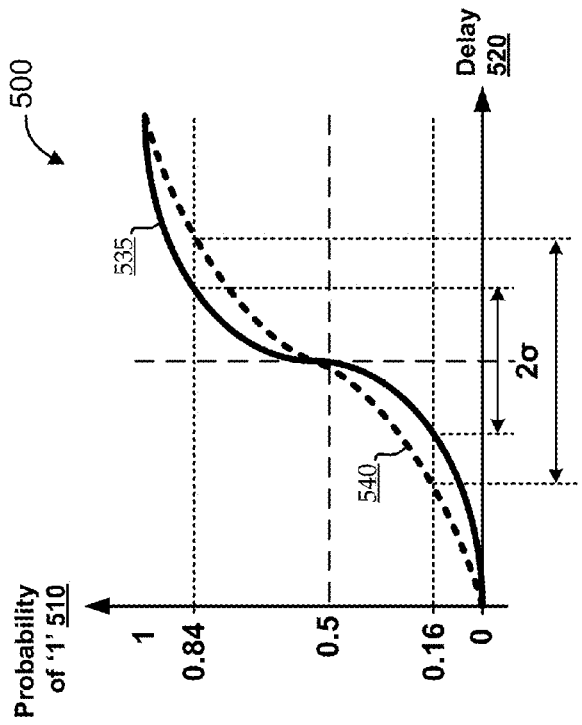
FIG. 5 shows a graph of the probability of the flip flop of FIG. 3 outputting a '1' over a sweep of reference clock signal delay amounts.
Figure 3:
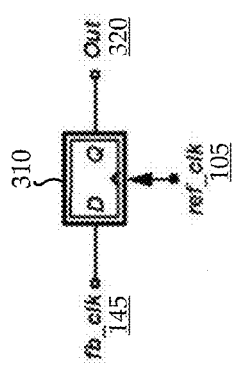
FIG. 3 shows a generic flip flop that generates an output decision as a function of the reference clock signal and the feedback clock signal.
Figure 4:
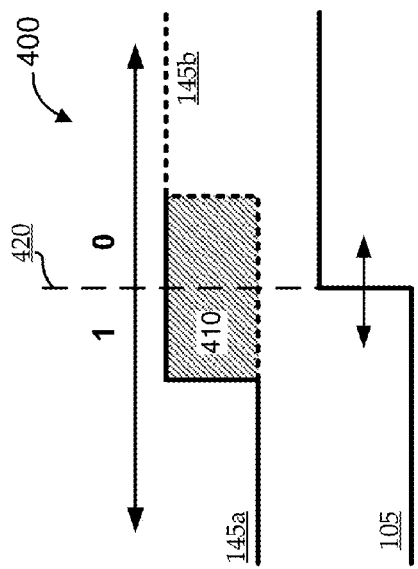
FIG. 4 shows a simplified signal diagram for the circuit of FIG. 3, including an ideal reference clock signal and an ideal feedback clock signal at two different relative phases.

FIGS. 3-5 provide additional foundation for the built-in RJ measurement approach of embodiments described herein. In general, RJ can manifest as a drifting of the phase of the PLL output signal 135 (and the feedback clock signal 145) relative to the reference clock signal 105. Accordingly, measuring the extent of the phase drift can yield an estimate of RJ. FIG. 3 shows a generic flip flop 310 that generates an output decision 320 as a function of the reference clock signal 105 and the feedback clock signal 145. For example, the flip flop 310 receives the feedback clock signal 145 as its input and is clocked according to the reference clock signal 105 (alternatively, the flip flop 310 could receive the reference clock signal 105 as its input and be clocked according to the feedback clock signal 145). In such an arrangement, assuming an ideal flip flop 310 (e.g., ignoring setup times, and the like), the output decision 320 will be asserted if the flip flop 310 is clocked when the feedback clock signal 145 is asserted. For example, if the reference clock signal 105 transitions to '1' while the feedback clock signal 145 is '1', the output decision is '1'.

FIG. 4 shows a simplified signal diagram for the circuit of FIG. 3, including an ideal reference clock signal 105 and an ideal feedback clock signal 145 at two different relative phases. If the feedback clock signal 145 is phase-advanced, as illustrated by feedback clock signal 145a, it will be HIGH when the reference clock signal 105 goes HIGH, such that the output decision 320 is HIGH ('1'). If the feedback clock signal 145 is phase-delayed, as illustrated by feedback clock signal 145b, it will be LOW when the reference clock signal 105 goes HIGH, such that the output decision 320 is LOW ('0'). As described above, RJ can cause the phase of the feedback clock signal 145 to drift relative to the reference clock signal 105. As an example, the feedback clock signal 145 can drift (e.g., oscillate) between the advanced feedback clock signal 145a and the delayed feedback clock signal 145b, leaving a region 410 corresponding to the amount of RJ (more RJ will result in a larger region 410). Over time, there will be some probability of getting a '1' as the output decision 320 that corresponds to the amount of RJ on the feedback clock signal 145 (i.e. the size of the region 410 due to RJ-caused drift of the feedback clock signal 145).

Notably, the probability of getting a '1' as the output decision 320 can also depend on the location of the transition of the reference clock signal 105 relative to the region 410 (represented as a dashed vertical line 420). For example, if the reference clock signal 105 is delayed, so that the transition 420 is towards the right side of the region 410, it is highly likely that the output decision 320 will be '1', even as the feedback clock signal 145 drifts over the region 410 (i.e., there would only be a small portion of the region that would result in a '0' output decision 320). In contrast, if the reference clock signal 105 is advanced, so that the transition 420 is towards the left side of the region 410, it is highly likely that the output decision 320 will be '0', even as the feedback clock signal 145 drifts over the region 410 (i.e., there would only be a small portion of the region that would result in a '1' output decision 320).

FIG. 5 shows a graph 500 of the probability of the flip flop of FIG. 3 outputting a '1' over a sweep of reference clock signal 105 delay amounts. The Y-axis 510 indicates the probability getting a '1' as the output decision 320, and the X-axis 520 indicates different amounts of introduced delay between the reference clock signal 105 and the feedback clock signal 145. For example, different amounts of delay can be applied to the feedback clock signal 145, causing the transition 420 to effectively sweep across a window at least as big as the region 410. At one extreme of the sweep window, where the reference clock signal 105 is advanced past the left edge of the region 410, there is effectively a zero probability that the output decision will be a '1'. At the other extreme of the sweep window, where the reference clock signal 105 is delayed past the right edge of the region 410, there is effectively a 100-percent probability that the output decision will be a '1'.

As illustrated, the probability distribution over the sweep window can typically follow a Gaussian distribution (or can effectively be modeled according to a Gaussian distribution). As the amount of RJ changes, the spread of the distribution changes. For example, in an ideal condition with no RJ, the region 410 is infinitely small, and the transition effectively has infinite slope (an infinitely sharp transition, like a square wave). As the amount of RJ increases, the distribution can spread until it approaches a linear distribution. For example, the graph 500 includes a first distribution plot 535 corresponding to a first RJ (e.g., 1 picosecond) and a second distribution plot 540 corresponding to a second RJ (e.g., 1.3 picoseconds). The second, higher RJ results in a distribution plot 540 with a smaller maximum slope.

In a Gaussian distribution, two standard deviations (σ) around the mean correspond to probabilities between 0.16 and 0.84. As illustrated on the graph 500, the intersections of those probabilities with points on a particular distribution plot define a 2σ range within the sweep window of the X-axis 520. As the spread changes, so do the extents of the 2σ range. Accordingly, the size of the 2σ range can directly correspond to the size of the region 410, which can directly correspond to the amount of RJ in the feedback clock signal 145, which can directly correspond to the amount of RJ in the PLL output signal 135. For example, σ can be used (directly or indirectly) as a measure of RJ.

Embodiments use such an approach to measure RJ of the PLL output signal 135. In practice, such an approach involves a number of elements. For example, embodiments can determine an appropriate sweep window that captures at least the relevant portion of the distribution (i.e., at least the range of probabilities from 0.16 to 0.84). Embodiments can then compute a distribution over the sweep window from which a delay range can be identified as corresponding to a. Some embodiments can then transform the delay range into an RJ time domain. In some embodiments, the approach can be used to compute RJ for each of a number of different PLL parameter 115 settings. For example, changing the PLL parameters 115 can cause a change in the amount of RJ seen on the PLL output signal 135. The PLL parameters 115 can then be set to result in the lowest (or otherwise in a reduced) amount of RJ. For example, the PLL parameters 115 can be hardware-configured one or more times, as desired, for calibration and/or for any other suitable purpose. In some implementations, where an integrated circuit includes multiple PLL modules 130 (e.g., in a large processor having tens of PLLs), the approach can be applied to some or all of the PLL modules 130 to calibrate the different PLL parameters 115 for the different PLL modules 130.

Figure 6:
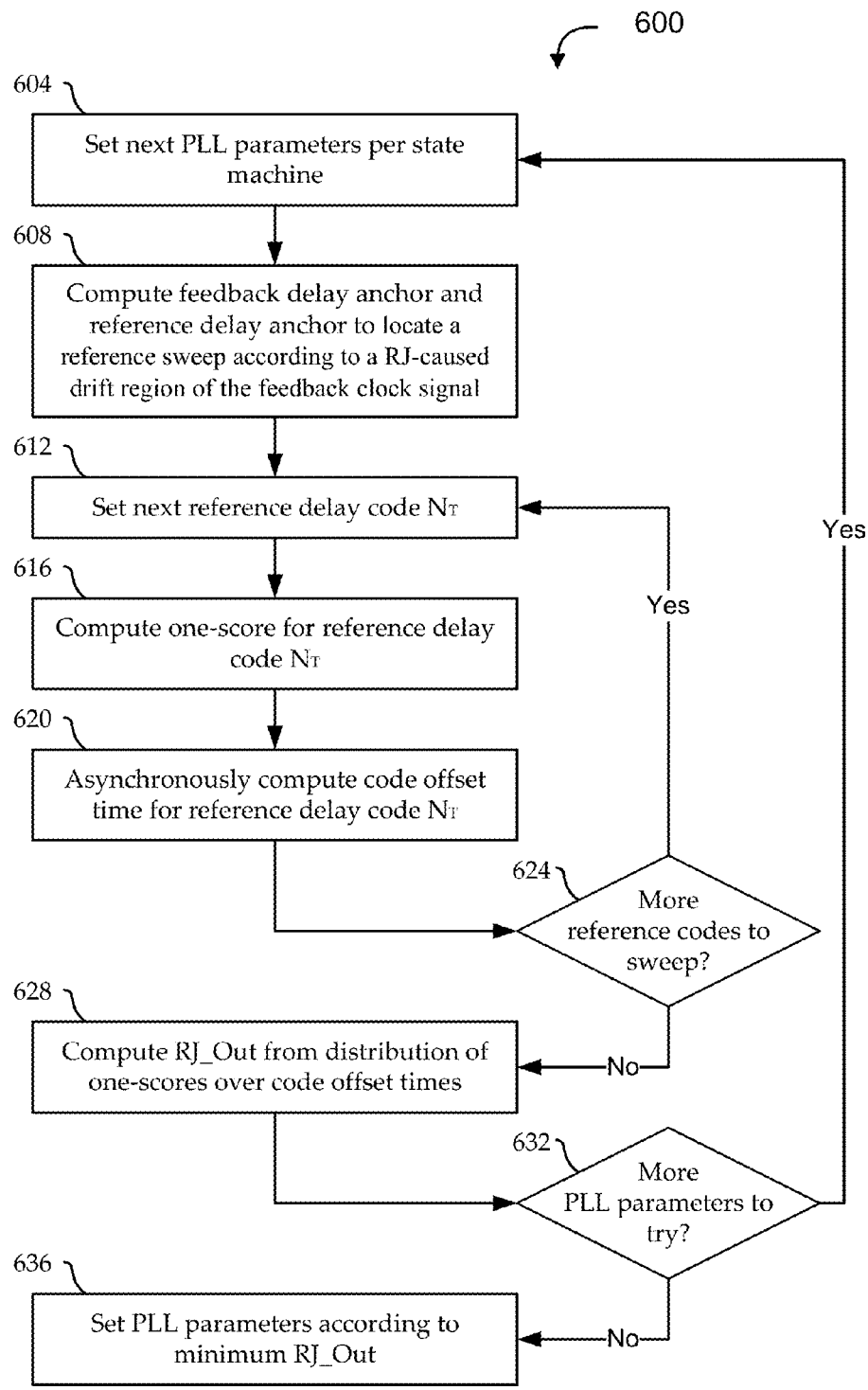
FIG. 6 shows an illustrative method for on-chip jitter measurement in a clocking circuits, according to various embodiments.

FIG. 6 shows an illustrative method 600 for on-chip jitter measurement in a clocking circuits, according to various embodiments. Embodiments are described in context of the clocking environments 100 and 200 of FIGS. 1 and 2 for added clarity. The method 600 can begin at stage 604 by adjusting PLL parameters 115 to a next setting. For example, the state machine 110 of the jitter measurement system 150 can have, stored thereon, a predetermined routine that defines which of the PLL parameters 115 to change in which order. Adjusting the PLL parameters 115 in stage 604 effectively sets the PLL module 130 in a particular configuration, so that an estimate of RJ can be computed for the PLL module 130 according to that configuration.

Having adjusted the PLL parameters 115, embodiments can compute the RJ estimate in stages 608-628, for example, using the RJ computation module 125. As described above, embodiments can determine an appropriate sweep window for capturing a sufficient portion of the drift region of the feedback clock signal 145 caused by RJ (e.g., the region 410 of FIG. 4). At stage 608, embodiments can compute a feedback delay anchor and a reference delay anchor to locate a reference sweep window according to a RJ-caused drift region of the feedback clock signal. For example, FIGS. 7 and 8, described below, show an illustrative approach to locating the reference sweep window.

Stages 612-624 can iteratively compute a distribution over the reference sweep window located in stage 608. At stage 612 a next reference delay code $N_T$ can be set. For example, the reference sweep window can be defined according to a range of delay codes (e.g., $N_0$ to $N_K$) used to apply varying amounts of delay to the reference clock signal 105. In each iteration of stages 612-624, the reference code can be incremented (e.g., by one or more code values). In stage 616, a "one-score" can be computed for the reference delay code. In some implementations, the one-score is a total number of '1's output from a component of the jitter measurement system 150 over a sample window. In other implementations, the one-score is a computed probability of a '1' output from the component of the jitter measurement system 150. For example, if the sample window is set to have Y samples, and X '1's are recorded over the sample window, the probability can be computed as X/Y. At stage 620, embodiments can compute a code offset time for the reference delay code. As described below, some implementations use an asynchronous approach to transform each increment in reference delay code to a delta in time. For example, the incremental delay added to the reference clock signal 105 by changing the reference delay code from $N_{T-1}$ to $N_T$ in stage 612 can correspond to an amount of time (e.g., depending on PLL frequency, delay code resolution, and/or other parameters). The time delta between reference delay codes may be different between different codes. At stage 624, a determination can be made as to whether more reference delay codes exist in the sweep window. If so, embodiments can continue to iterate through stages 612-624 until the entire sweep range is covered. If not, embodiments can proceed to stage 628.

Iterating through stages 612-624 over the reference sweep window can result in a one-score distribution over a time window corresponding to the reference sweep window. At stage 628, embodiments can compute a RJ output signal 155 from the distribution of one-scores computed over the reference sweep window (i.e., over the references code offset times). For example, as described above, the RJ output signal 155 can be computed according to one standard deviation from the mean of the distribution, which can be half of the range of delay times corresponding to the range of probabilities between 0.16 to 0.84.

In some embodiments, the method 600 can iterate through different PLL parameter 115 settings seeking a minimum RJ. For example, embodiments can determine, at stage 632, whether additional PLL parameter 115 settings are left to try (e.g., according to a state machine 110 routine). If so, the method 600 can iterate to stage 604, where new settings can be applied to one or more PLL parameters 115. For example, in each iteration, the RJ output signal 155 can be stored in association with the set of PLL parameters 115. In some implementations, the RJ output signal 155 can be output from the RJ computation module 125 of the jitter measurement system 150 and can be recorded by the state machine 110 of the jitter measurement system 150. Alternatively, the state machine 110 can record a lowest RJ output signal 155 (e.g., if the RJ output signal 155 for a particular set of PLL parameters 115 is higher than its previously recorded minimum, the RJ output signal 155 is ignored; and if the RJ output signal 155 reflects a lower RJ than what was previously recorded, the corresponding set of PLL parameters 115 can be recorded as a new minimum). If it is determined at stage 632 that all the PLL parameter 115 settings have been tried (i.e., a "NO" determination at stage 632), embodiments can set the PLL parameters 115 to produce a minimum RJ on the PLL output signal 135. For example, the PLL parameters 115 can be set according to those computed to result in a minimum RJ output signal 155.

Figure 7:
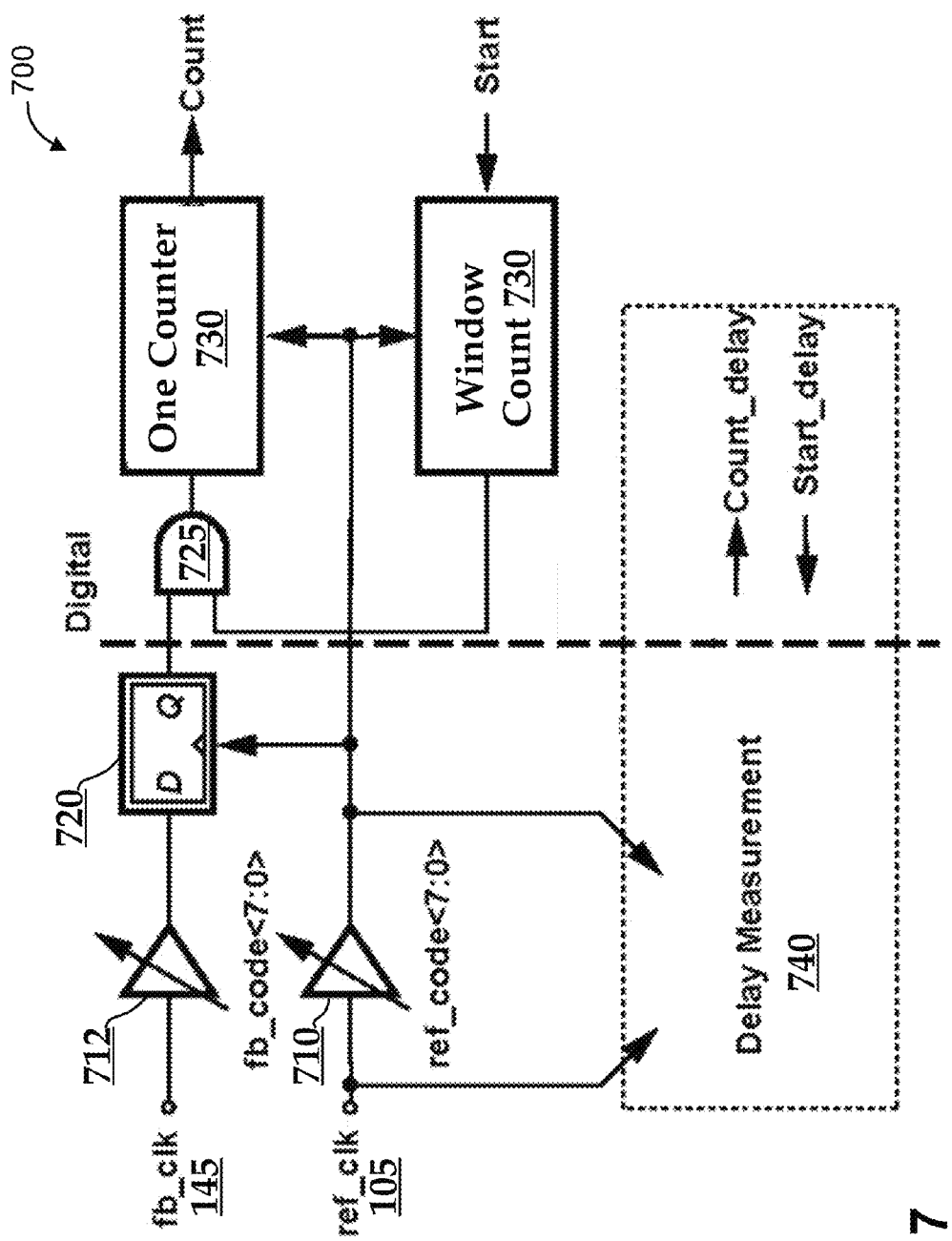
FIG. 7 shows an illustrative circuit for implementing the jitter measurement system, according to various embodiments.

FIG. 7 shows an illustrative circuit 700 for implementing the jitter measurement system 150, according to various embodiments. Embodiments of the circuit 700 receive the reference clock signal 105 and the feedback clock signal 145 and can apply a programmable amount of delay to one or both signals using a reference delay generator 710 and a feedback delay generator 712, respectively. The reference delay generator 710 and the feedback delay generator 712 can be implemented in any suitable manner to achieve the type of delay (e.g., resolution) desired.

Figure 8:
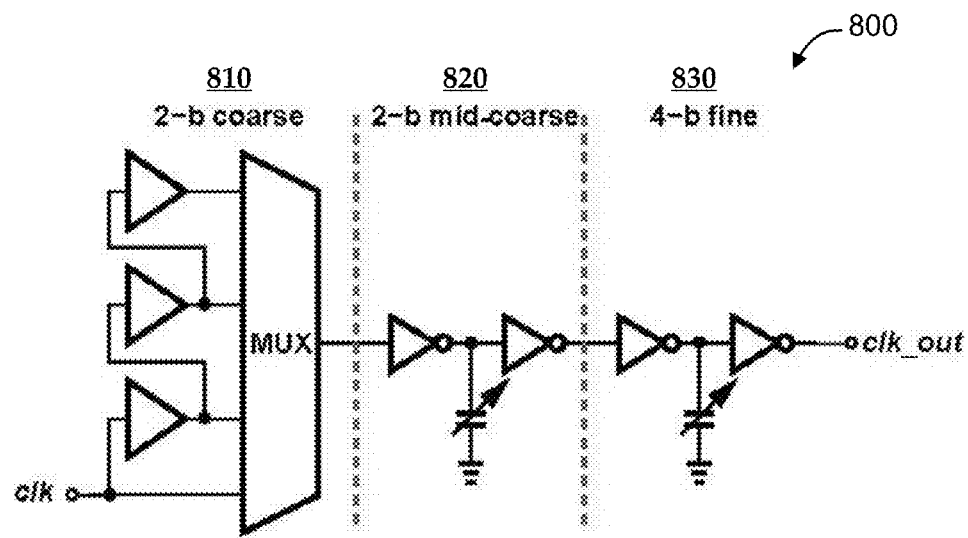
FIG. 8 shows an illustrative delay generator circuit that can be used to implement the reference delay generator and/or the feedback delay generator.
Figure 9:
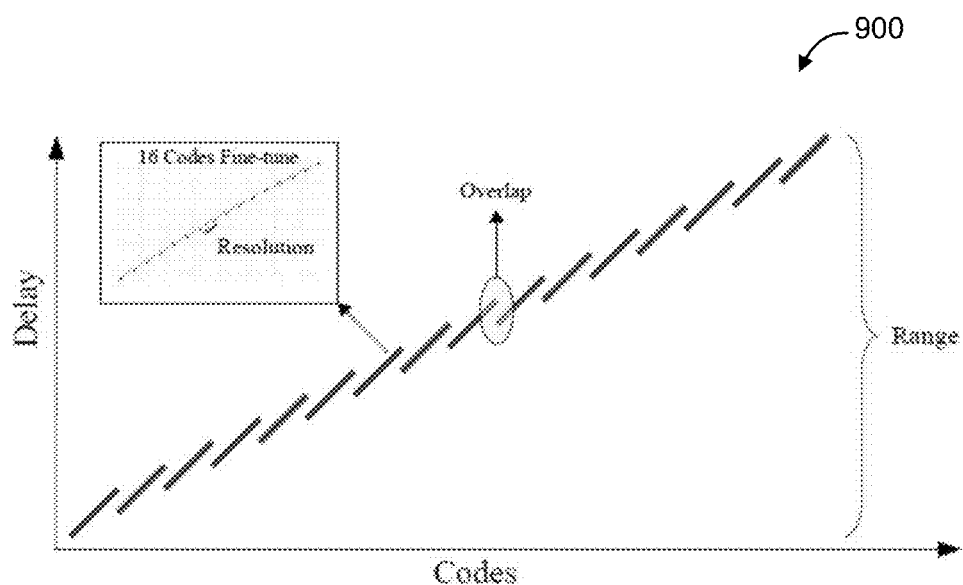
FIG. 9 shows a graph of an illustrative plot of the amount of delay added by the delay generator circuit at different delay code values.

Turning briefly away from FIG. 7, FIG. 8 shows an illustrative delay generator circuit 800 that can be used to implement the reference delay generator 710 and/or the feedback delay generator 712. As illustrated, the delay generator circuit 800 includes a coarse adjustment phase 810 (e.g., two-bit), a mid-coarse adjustment phase 820 (e.g., two-bit), and a fine adjustment phase 830 (e.g., four-bit). In the coarse adjustment phase 810, a stack of delay elements is coupled with a multiplexer, so that the output of the multiplexer is a selected version (according to two selection bits) of the input as having passed through 0, 1, 2, or 3 delay elements. In the mid-coarse adjustment phase 820, two selection bits can be used to set a variable capacitance of a ground-coupled variable capacitor coupled between two inverters, thereby effectively applying additional delay. In the fine adjustment phase 830, four selection bits can be used to set a variable capacitance of another ground-coupled variable capacitor coupled between two more inverters, thereby effectively applying additional delay. FIG. 9 shows a graph 900 of an illustrative plot of the amount of delay added by the delay generator circuit 800 at different delay code values. As the code increases, the delay increases. As illustrated, the delay change may not necessarily be linear over all codes. While delay line linearity is not critical, some embodiments depend on a monotonic change within the coarse, mid-coarse, and fine codes.

Returning to FIG. 7, the output of the feedback delay generator 712 can be passed to the input of a latch 720 (e.g., a flip flop), and the latch 720 can be clocked according to the output of the reference delay generator 710. As described with reference to FIGS. 3 and 4 above, even with the reference delay generator 710 and the feedback delay generator 712 set to a particular value, the output of the latch 720 (e.g., a decision of '1' or '0') can statistically depend on RJ on the feedback clock signal 145. Further, as described with reference to FIGS. 4 and 5 above, adjusting the setting of the reference delay generator 710 can sweep a transition point over a reference delay window. Accordingly, by maintaining the setting of the feedback delay generator 712, and sweeping the setting of the reference delay generator 710 over a range, a one-score can be computed from the output of the latch 720 at each delay code.

For example, at each delay code, a sample window counter 735 can establish a fixed-size sample window by counting a predetermined number of samples of the latch 720 output (e.g., the sample window is Y samples corresponding to Y cycles of the reference clock signal 105). For each sample time in the sample window, a one-counter 730 can obtain a count of '1' output determinations from the latch 720 (e.g., or '0's in other implementations). For example, as illustrated, the sample window counter 735 can assert one input to an AND gate 725 during the sample window, and the other input of the AND gate 725 can be coupled to the output of the latch 720, so that the output of the AND gate 725 is effectively the output of the latch 720 during the sample window and '0' otherwise. The one-count from the one-counter 730 can be used to compute a one-score for the particular reference delay generator 710 code setting. For example, the one-score can be the one-count (e.g., X), the one-score can be computed as a ratio of the one-count to the total number of samples in the sample window (e.g., X/Y), etc.

Figure 10:
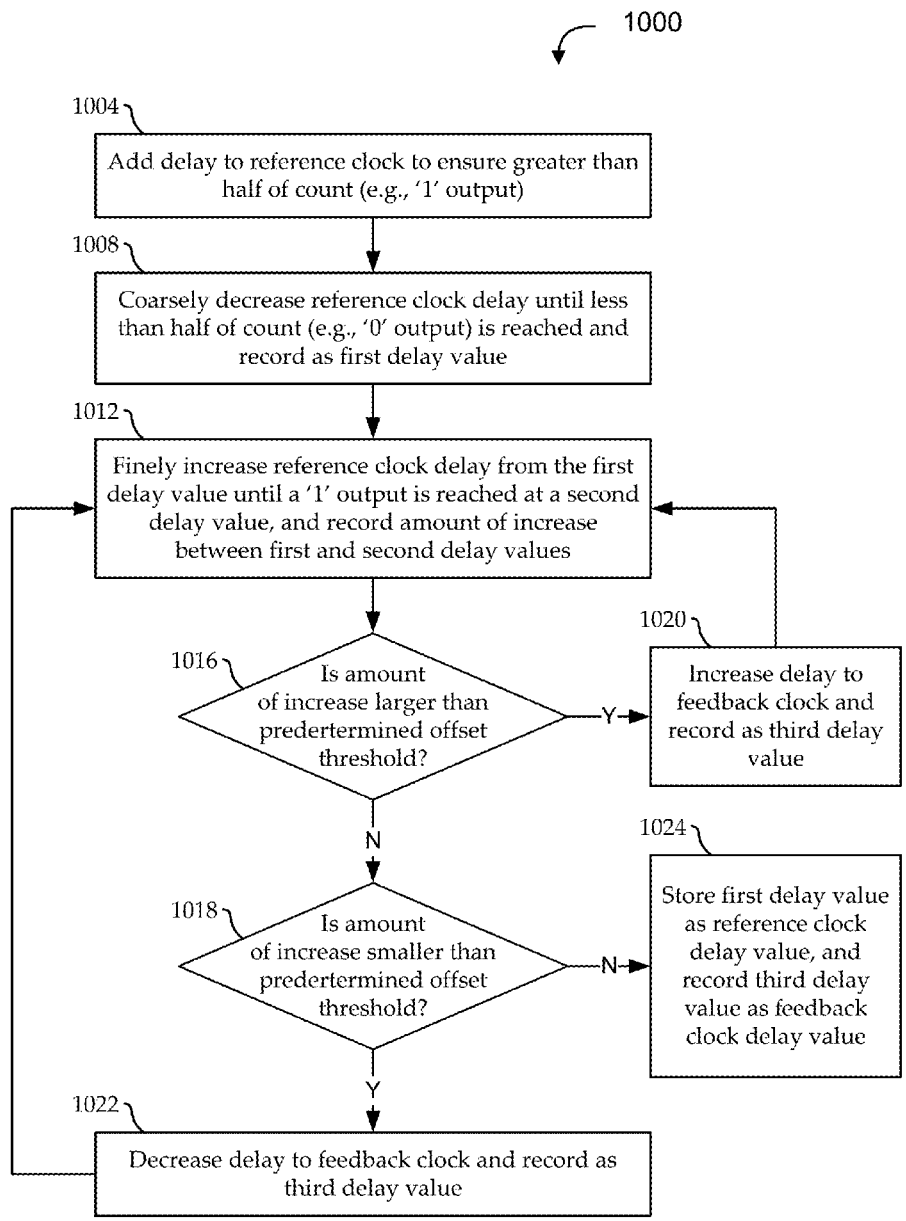
FIG. 10 shows a flow diagram of an illustrative method for determining an appropriate reference sweep window.

As described above, some embodiments determine an appropriate reference sweep window prior to using the reference window to compute the one-score distribution. An illustrative approach to determining an appropriate reference sweep window is shown in FIGS. 10 and 11A-11D. FIG. 10 shows a flow diagram of an illustrative method 1000 for determining an appropriate reference sweep window, and FIGS. 11A-11D shows an illustrative graphical representation of the method 1000 of FIG. 10. As described with reference to FIG. 5, the graph 1100a plots a distribution 535 of probability of a '1' determination (e.g., or, more generally, of any suitable one-score) over a references sweep window (e.g., over different delay code values applied to the reference delay generator 710).

The method 1000 begins at stage 1004 by adding sufficient delay to the reference clock signal 105 to ensure a location that is greater than half the total count (e.g., to ensure a '1' output determination). For example, the reference delay generator 710 is set with a high delay code to ensure that the transition point for the reference clock signal 105 is delayed past the RJ-caused drift region of the feedback clock signal 145. Stage 1004 is graphically represented in FIG. 11A by graph 1100a. As illustrated, the delay applied in stage 1004 can locate a candidate reference delay anchor 1110 far to the right of the distribution 535.

At stage 1008, the delay applied to the reference clock signal 105 can be coarsely decreased (e.g., by decreasing the coarse adjustment bits and/or the mid-coarse adjustment bits) until less than half the total count is reached (e.g., a '0' output determination is reached). Stage 1008 is graphically represented in FIG. 11B by graph 1100b. As illustrated, coarse reduction in delay can shift the candidate reference delay anchor 1110 in the direction of arrow 1115 to an updated candidate reference delay anchor 1120 (now toward the left of the distribution 535).

The method 1000 can proceed by iteratively finding a reference delay anchor 1110 and a feedback delay anchor that correspond to an appropriate reference sweep window. At stage 1012, the delay applied to the reference clock signal 105 can be finely increased from a first code corresponding to the updated candidate reference delay anchor 1120 (e.g., by increasing the fine adjustment bits) until a '1' output determination is again reached at a second delay code. Implementations record the number of codes between the first and second codes, which can effectively be the number of codes between the updated candidate reference delay anchor 1120 and the middle of the distribution. A determination can be made at stage 1016 as to whether the number of codes is more than some predetermined offset threshold. For example, setting the offset threshold to eight codes can correspond to locating the reference sweep window to have eight codes on either side of the mean of the distribution. If the determination at stage 1016 is that the delay value is greater than the offset threshold (e.g., that the number of delay codes is greater than, or at least equal to in some cases, the offset threshold), embodiments can increase delay to (e.g., advance) the feedback clock signal 145 at stage 1020. If the determination at stage 1016 is that the delay value is not greater than the offset threshold, a further determination can be made at stage 1018 as to whether the number of codes is less than the predetermined offset threshold. If the determination at stage 1018 is that the delay value is less than the offset threshold (e.g., that the number of delay codes is less than, or at most equal to in some cases, the offset threshold), embodiments can decrease delay to (e.g., retard) the feedback clock signal 145 at stage 1022. If the determination at stage 1018 is that the delay value is not less than the offset threshold (i.e., not greater than or less than, such that it is within, the offset threshold), the updated candidate reference delay anchor 1120 can be stored as the reference delay anchor at stage 1024.

In some implementations, the delay code of the feedback delay generator 712 can be increased or decreased. For example, if the number of codes exceeds the offset threshold, the updated candidate reference delay anchor 1120 may be too far left, and the delay code for the feedback delay generator 712 can be adjusted to shift the distribution 535 left; and if the number of codes is less than the offset threshold, the updated candidate reference delay anchor 1120 may be too far right, and the delay code for the feedback delay generator 712 can be adjusted to shift the distribution 535 right. Other implementations can accomplish a similar result in a different way. For example, if the updated candidate reference delay anchor 1120 appears to be too far right (i.e., too close to the mean of the distribution), the delay applied to the reference clock signal 105 can be further reduced. However, using delay settings on both the reference delay generator 710 and the feedback delay generator 712 can be more robust, as they can be less prone to running out of available codes.

Stages 1012-1024 are graphically represented in FIGS. 11C and D by graphs 1100c and 1100d. As illustrated, iteratively applying a fine increase in delay can iteratively move the updated candidate reference delay anchor 1120 in the direction of arrow 1325 until it crosses the mean of the distribution 535 at a new location 1130. In the illustrated attempt of FIG. 11C, only six code increases were used, and the offset threshold is eight codes. Accordingly, in FIG. 11D, the distribution 535 is shifted to distribution 535', which causes the updated candidate reference delay anchor 1120 to shift to 1120'. Another iteration can attempt to determine whether, given the shifted distribution 535', it will now take eight codes to move the updated candidate reference delay anchor 1120 in the direction of arrow 1325 until it crosses the mean of the distribution 535.

Returning to FIG. 7, as described with reference to FIGS. 8-11D, the top half of the circuit 700 can be used to determine an appropriate reference sweep window and to compute a one-score distribution over the sweep window. As described above, the one-code distribution can be used to compute an RJ estimate. For example, embodiments can determine a first reference sweep window extent as the reference delay code corresponding to a smallest one-score that exceeds a 0.16 probability; and embodiments can determine a second reference sweep window extent as the reference delay code corresponding to a smallest one-score that exceeds a 0.84 probability. The computed extents then correspond to a 2σ region around the mean of the distribution. Some implementations can use the range of delay codes directly (without transformation into another domain). Other implementations can include a look up table or other data store that stores a mapping or other correspondence between delay codes and amounts of time. In still other implementations, the circuit 700 includes components for transforming the computed distribution into an appropriate time domain. For example, the bottom half of the circuit 700 is illustrated as delay measurement circuit 740, which can be used to translate the reference sweep window into a RJ time domain.

Figure 12:
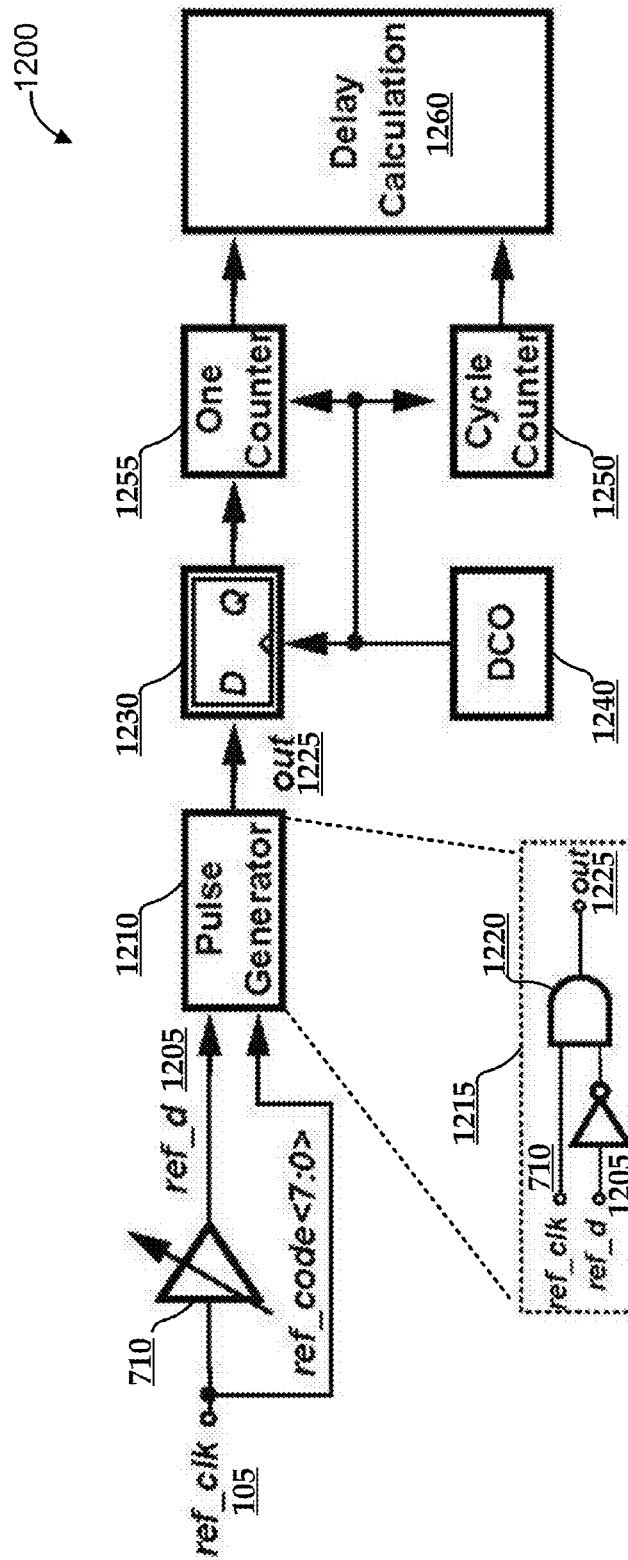
FIG. 12 shows a circuit diagram of an illustrative implementation of the delay measurement circuit, according to various embodiments.
Figure 13:
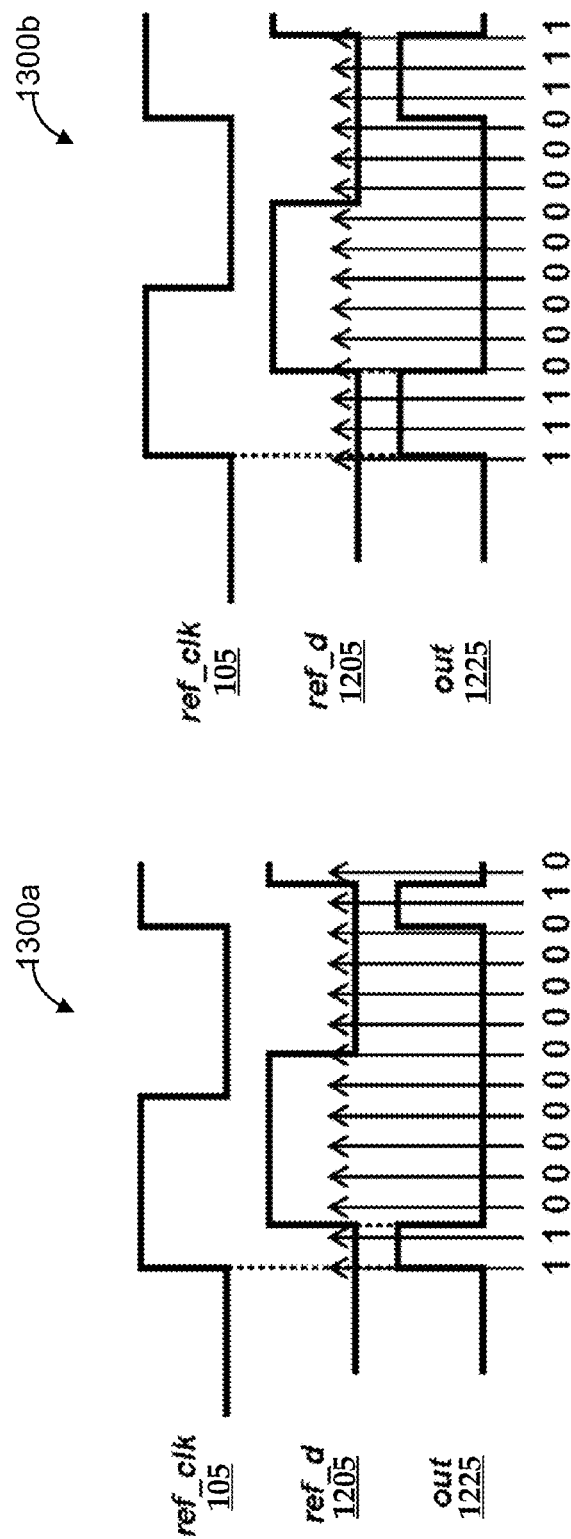
FIGS. 13A and 13B show graphical illustrations of operation of the circuit of FIG. 12.

FIG. 12 shows a circuit diagram 1200 of an illustrative implementation of the delay measurement circuit 740, according to various embodiments. FIGS. 13A and 13B show graphical illustrations of operation of the circuit 1200 of FIG. 12. The circuit 1200 can use the reference clock signal 105 and the output of the reference delay generator 710 (a delayed reference signal 1205) to generate a pulse. Though the circuit 1200 is illustrated as including the reference delay generator 710, embodiments can be coupled to the input and output sides of the reference delay generator 710 in the circuit of FIG. 7 (i.e., the input of the reference delay generator 710 is the reference clock signal 105, and the output of the reference delay generator 710 is the delayed reference signal 1205 delayed by an amount corresponding to the selected delay code).

The reference clock signal 105 and the delayed reference signal 1205 can be coupled to inputs of a pulse generator 1210. The pulse generator 1210 can be implemented in any suitable manner to generate a pulse having a width that corresponds to the amount of delay applied by the reference delay generator 710. One implementation of such a pulse generator 1210 is illustrated as circuit 1215. As illustrated, the reference clock signal 105 can be coupled to an input of an AND gate 1220, and the complement of the delayed reference signal 1205 can be coupled to the other input of the AND gate 1220 (e.g., the delayed reference signal 1205 can be coupled to the other input of the AND gate 1220 via an inverter, etc.). For example, FIGS. 13A and 13B illustrate the reference clock signal 105, the delayed reference signal 1205, and the resulting pulse output 1225 of the pulse generator 1210. As illustrated, the applied delay is greater in FIG. 13B than in FIG. 13A, and the width of the pulse output 1225 is greater in FIG. 13B than in FIG. 13A, accordingly.

The pulse output 1225 can be coupled to a latch 1230 that is clocked according to an asynchronous clocking signal 1245 generated by an asynchronous clock generator 1240. For example, the asynchronous clock generator 1240 can be implemented as a digitally controlled oscillator (DCO) (e.g., with two bits of frequency control, or any other suitable parameters) that is asynchronous with respect to the reference clock signal 105. Being asynchronous, if enough samples are acquired over a long enough sample period, it is statistically likely that all points over an entire period of the pulse output 1225 will be sampled (e.g., if the samples are all mathematically folded back to a single pulse output 1225 period). To that end, embodiments of the circuit 1200 also include a cycle counter 1250 and a one-counter 1255, each also clocked according to the asynchronous clock generator 1240. The cycle counter 1250 can generate a sample window of a predetermined fixed number of cycles of the asynchronous clock generator 1240 (corresponding to a fixed number of samples). At each sample time over the sample window, the one-counter 1255 can record whether the pulse output 1225 is a '1' or a '0'. Assuming the sample window is sufficiently large, the total count of '1's (or '0's) over the entire sample window, relative to the total number of samples in the window, can accurately represent the pulse width of the pulse output 1225. FIGS. 13A and 13B illustrate a number of asynchronous samples taken over multiple periods of the pulse output 1225, where FIG. 13A represents the delayed reference signal 1205 at a first delay code value, and FIG. 13B represents the delayed reference signal 1205 at a next delay code value. As illustrated, the pulse width changes from FIG. 13A to FIG. 13B, as does the one-count (i.e., the one-count corresponds to the pulse width).

After the cycle counter 1250 finishes its sample window, and the one-counter 1255 generates its one-count, a delay calculator 1260 can derive a delay code offset time for that delay code in a time-basis. In some implementations, the delay calculator 1260 receives a first one-count (N0) from the one-counter 1255 that corresponds to previous reference delay code, a second one-count (N1) from the one-counter 1255 that corresponds to the present reference delay code, a total number of samples N in each sample window from the cycle counter 1250, and the sample period (Tref, in time domain) of the asynchronous clock generator 1240. The delay code offset time between the previous delay code and the present reference delay code can be computed as: (N1−N0)*Tref/N. For example, suppose Tref is 1 nanosecond, N is 2^11 samples, N0 is 1091 '1' samples, and N1 is 1257 '1' samples. In such a case, the delay code offset time is (1257−1091)*1 ns/2^11≈81 picoseconds. A larger N can yield a higher resolution. For example, using N=2^11, the resolution can be computed at Tref/N=1 ns/2^11≈0.5 picoseconds; and using N=2^22, the resolution can be computed at 1 ns/2^22≈0.238 femtoseconds.

Figure 14:
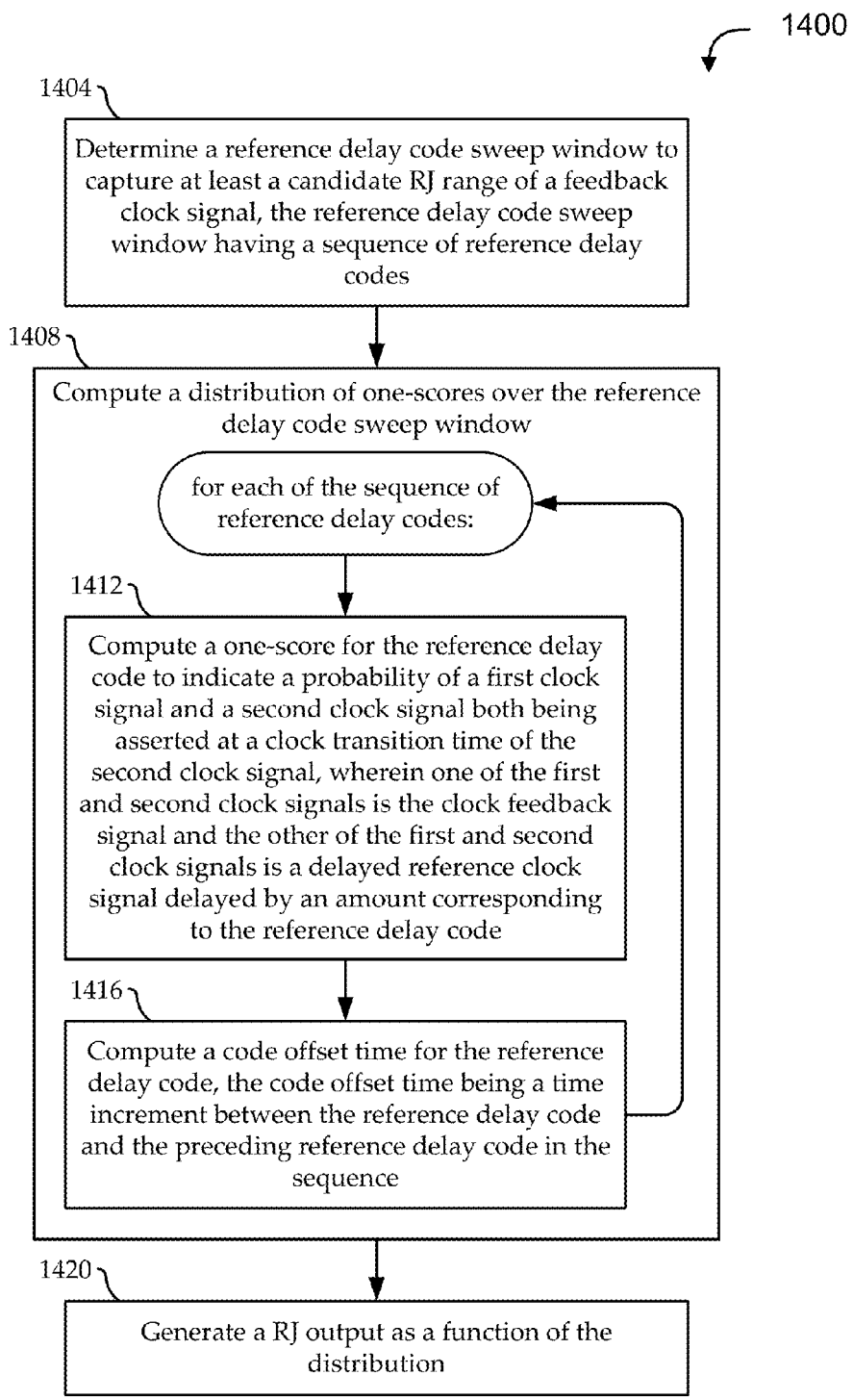
FIG. 14 shows a flow diagram of a method for on-chip random jitter (RJ) measurement in a clocking circuit, according to various embodiments.

FIG. 14 shows a flow diagram of a method 1400 for on-chip random jitter (RJ) measurement in a clocking circuit, according to various embodiments. In some embodiments, the method can be an implementation of portions of the method 600 of FIG. 6. Further, the method 1400 can be implemented using any of the systems described above, or any other suitable system. As described above, embodiments can operate in context of a PLL circuit, for example, as part of a SERDES circuit. Some implementations perform the method 1400 for each of number of different sets of PLL parameters to identify a PLL configuration that yields a lowest amount of RJ on its output.

Embodiments begin at stage 1404 by determining a reference delay code sweep window to capture at least a candidate RJ range of a feedback clock signal. For example, the candidate RJ range can be based on an amount of drift in the feedback clock signal likely to manifest from an excessively large amount of RJ. The reference delay code sweep window includes a sequence of reference delay codes, each operable to add a corresponding amount of delay to a reference clock signal to generate a delayed reference clock signal. Some embodiments perform the determining by setting the reference delay code to delay the reference clock signal to a location past the candidate RJ range at which sampling the clock feedback signal according to the delayed reference clock signal is probabilistically certain (i.e., the system can assume that a '1' sample will result) to achieve a '1' sample. Generally, embodiments that refer to achieving a '1' sample, or the like, can alternatively be modified to achieve a '0' sample, or in any other suitable manner. The determining can then proceed to look for a reference anchor point (i.e., a start of the reference delay code sweep window) that is approximately centered around a transition point, which may substantially correspond to the mean of the one-score distribution that will ultimately be computed). For example, a reference anchor location can be located by iteratively applying a coarse reduction to the reference delay code to iteratively advance the delayed reference clock signal (e.g., phase-shift the delayed reference clock signal to the left), sampling the clock feedback signal according to the delayed reference clock signal in each iteration, until a '0' sample is achieved (i.e., when the '0' sample is first achieved, the reference delay code for that iteration can indicate the candidate reference anchor location). The position of the transition point can then be iteratively refined with respect to the reference anchor location by positioning it at approximately a predetermined offset threshold (e.g., delay distance, number of reference codes, etc.) from the reference anchor location. For example, until a number of fine iterations corresponds to a predetermined offset threshold, implementations can iteratively apply a fine increase to the reference delay code to iteratively delay the reference clock signal, sampling the clock feedback signal according to the delayed reference clock signal in each iteration, until a '1' sample is achieved after a number of fine iterations (F). In each iteration, a determination can be made as to whether F corresponds to the predetermined offset threshold. If F exceeds the predetermined offset threshold, that can indicate that the reference anchor point is too far from the transition point, and a feedback delay code can be applied to advance the clock feedback signal (e.g., or, alternatively, the reference delay code can be adjusted to delay the delayed reference clock signal). If F is less than the predetermined offset threshold, that can indicate that the reference anchor point is too close to the transition point, and a feedback delay code can be applied to delay the clock feedback signal (e.g., or, alternatively, the reference delay code can be adjusted to advance the delayed reference clock signal). Once F corresponds to the offset threshold, the reference delay code corresponding to the reference anchor location and the feedback delay code corresponding to the shifted location of the feedback clock signal can be stored as settings to define the reference delay code sweep window. For example, the reference delay code sweep window comprises a sequence of 2F reference delay codes (or fewer codes spanning a range of 2F codes) beginning at the reference delay code corresponding to the reference anchor location.

At stage 1408, embodiments compute a distribution of one-scores over the reference delay code sweep window, for example, by iterating through stages 1412 and 1416 for each of the sequence of reference delay codes. In stage 1412, a one-score can be computed for the reference delay code. The one-score can indicate a probability of a first clock signal and a second clock signal both being asserted at a clock transition time of the second clock signal (e.g., as a count of '1' samples, as a ration of '1' samples to total samples in a sampling window, or in any other suitable manner). One of the first and second clock signals is the clock feedback signal and the other of the first and second clock signals is a delayed reference clock signal (being the reference clock signal delayed by an amount corresponding to the reference delay code for the iteration). For example, the feedback clock signal can be sampled (e.g., by a latch) at each of a number of cycles of the delayed reference clock signal. In some embodiments, the computation in stage 1412 can include sampling the clock feedback signal at each of Y cycles of the delayed reference clock signal (the delayed reference clock signal delayed according to the reference delay code), where Y is a predefined cycle count of a sampling window. In such embodiments, the one-score can corresponding to a total count of '1' samples (X) obtained over the sampling window (e.g., as the count itself, a ration of the count to the total number of samples (X/Y), or in any other suitable manner).

In stage 1416, a code offset time can be computed for the reference delay code of the iteration. The code offset time is a time increment between the reference delay code and the preceding reference delay code in the sequence (i.e., an amount of added delay applied to the reference clock signal by incrementing from the previous reference delay code in the sequence and the present reference delay code for the iteration). In some embodiments, the computation in stage 1416 includes generating a pulse signal having a pulse width corresponding to the amount of delay applied by the reference delay code to the reference clock signal to generate the delayed reference clock signal, and asynchronously sampling the pulse signal at each of K cycles of a sampling clock generated asynchronously with respect to the reference clock signal (K is a predefined cycle count of a sampling window). In such embodiments, the code offset time can be computed as a function of a total count of '1' samples ($J_N$) obtained over the sampling window, a code offset time associated with an adjacent reference delay code in the sequence ($J_{N-1}$), K, and a sampling period of the sampling clock (Tref). For example, the code offset time can be computed as $(J_N - J_{N-1})*Tref/K$.

Having iterated through all the reference delay codes in the sequence to compute the distribution, embodiments can generate a RJ output as a function of the distribution at stage 1420. In some embodiments, the computation in stage 1420 includes identifying a subset of the reference delay codes of the reference delay code sweep window as approximating one standard definition from the mean of the distribution, and computing a total subset offset time as a function of the code offset times for the subset of the reference delay codes. In such embodiments, the RJ output can be computed as the total subset offset time. In some such embodiments, the subset of the reference delay codes can be identified by determining a first reference delay code as yielding a one-score of approximately one standard deviation below the mean of the distribution, determining a second reference delay code as yielding a one-score of approximately one standard deviation above the mean of the distribution. The subset of the reference delay codes can then be identified as approximately half of the subsequence of reference delay codes between the first and second reference delay codes.

As described above, embodiments described herein can measure RJ while a PLL is operating in a deployed context (e.g., in context of temperature and/or other environmental changes, impacts from other components in the system, etc.). Accordingly, RJ measurements can be obtained at various times for various reasons. In some embodiments, the RJ measurements are obtained as part of a one-time calibration routine to program PLL parameters in their deployed environment. In other embodiments, the RJ measurements are obtained during each chip power-up sequence as a health check for the chip. In such embodiments, measurement of RJ outside a certain acceptable level can trigger a flag or other suitable indication. For example, other techniques can be used to adjust parameters of the PLL (e.g., automatically) in response to such a flag. In other embodiments, the RJ measurements are acquired as part of a health monitoring or debug routine. Such a routine can be run periodically (e.g., automatically on a schedule), on demand (e.g., initiated by a user via an interface), or in any other suitable manner. The measurement results can be reported as part of the routine and can be used, for example, for early warning (e.g., to trigger replacement of the chip), for calibration (e.g., to adjust PLL parameters), etc.

The methods disclosed herein comprise one or more actions for achieving the described method. The method and/or actions may be interchanged with one another without departing from the scope of the claims. In other words, unless a specific order of actions is specified, the order and/or use of specific actions may be modified without departing from the scope of the claims.

The steps of a method or algorithm or other functionality described in connection with the present disclosure, may be embodied directly in hardware, in a software module executed by a processor, or in a combination of the two. A software module may reside in any form of tangible storage medium. Some examples of storage media that may be used include random access memory (RAM), read only memory (ROM), flash memory, EPROM memory, EEPROM memory, registers, a hard disk, a removable disk, a CD-ROM and so forth. A storage medium may be coupled to a processor such that the processor can read information from, and write information to, the storage medium. In the alternative, the storage medium may be integral to the processor. A software module may be a single instruction, or many instructions, and may be distributed over several different code segments, among different programs, and across multiple storage media. Thus, a computer program product may perform operations presented herein. For example, such a computer program product may be a computer readable tangible medium having instructions tangibly stored (and/or encoded) thereon, the instructions being executable by one or more processors to perform the operations described herein. The computer program product may include packaging material. Software or instructions may also be transmitted over a transmission medium. For example, software may be transmitted from a website, server, or other remote source using a transmission medium such as a coaxial cable, fiber optic cable, twisted pair, digital subscriber line (DSL), or wireless technology such as infrared, radio, or microwave.

Other examples and implementations are within the scope and spirit of the disclosure and appended claims. For example, features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples.

Various changes, substitutions, and alterations to the techniques described herein can be made without departing from the technology of the teachings as defined by the appended claims. Moreover, the scope of the disclosure and claims is not limited to the particular aspects of the process, machine, manufacture, composition of matter, means, methods, and actions described above. Processes, machines, manufacture, compositions of matter, means, methods, or actions, presently existing or later to be developed, that perform substantially the same function or achieve substantially the same result as the corresponding aspects described herein may be utilized. Accordingly, the appended claims include within their scope such processes, machines, manufacture, compositions of matter, means, methods, or actions.

What is claimed is:

1. A method for on-chip random jitter (RJ) measurement in a clocking circuit, the method comprising:
   determining a reference delay code sweep window to capture at least a candidate RJ range of a feedback clock signal, the reference delay code sweep window comprising a sequence of reference delay codes;
   computing a distribution of one-scores over the reference delay code sweep window by, for each of the sequence of reference delay codes:
      computing a one-score for the reference delay code, the one-score indicating a probability of a first clock signal and a second clock signal both being asserted at a clock transition time of the second clock signal, wherein one of the first and second clock signals is the clock feedback signal and the other of the first and second clock signals is a delayed reference clock signal, the delayed reference clock signal being a reference clock signal delayed by an amount corresponding to the reference delay code;
      computing a code offset time for the reference delay code, the code offset time being a time increment between the reference delay code and the preceding reference delay code in the sequence; and
   generating a RJ output as a function of the distribution.

2. The method of claim 1, wherein the clock feedback signal is generated by a phase-locked loop (PLL) circuit.

3. The method of claim 2, further comprising:
performing the determining, the computing, and the generating for each of a plurality of sets of PLL parameters, such that each set of PLL parameters is associated with a respective RJ output;
identifying one of the set of PLL parameters as being associated with a lowest of the RJ outputs.

4. The method of claim 3, further comprising:
hardware-configuring the PLL according to the identified set of PLL parameters.

5. The method of claim 1, wherein determining the reference delay code sweep window comprises:
setting the reference delay code to delay the reference clock signal to a location past the candidate RJ range at which sampling the clock feedback signal according to the delayed reference clock signal is probabilistically certain to achieve a '1' sample;
iteratively applying a coarse reduction to the reference delay code to iteratively advance the reference clock signal, sampling the clock feedback signal according to the delayed reference clock signal in each iteration, until a '0' sample is achieved;
storing the reference delay code at which the '0' sample is received as a reference anchor location;
until a number (F) of fine iterations corresponds to a predetermined offset threshold:
iteratively applying a fine increase to the reference delay code to iteratively delay the reference clock signal, sampling the clock feedback signal according to the delayed reference clock signal in each iteration, until a '1' sample is achieved after F fine iterations;
determining whether F corresponds to a predetermined offset threshold;
when F exceeds the predetermined offset threshold, adjusting a feedback delay code to advance the clock feedback signal; and
when F is less than the predetermined offset threshold, adjusting the feedback delay code to delay the clock feedback signal; and
when F corresponds to the predetermined offset threshold, storing the feedback delay code at which F corresponds to the offset threshold as a feedback anchor location,
wherein the reference delay code sweep window is defined according to the reference anchor location and the feedback anchor location.

6. The method of claim 5, wherein the reference delay code sweep window comprises a sequence of 2F reference delay codes beginning at the reference delay code corresponding to the reference anchor location.

7. The method of claim 1, wherein computing the one-score for each reference delay code comprises:
sampling the clock feedback signal at each of Y cycles of the delayed reference clock signal, the delayed reference clock signal delayed according to the reference delay code, Y being a predefined cycle count of a sampling window,
the one-score corresponding to a total count of '1' samples (X) obtained over the sampling window.

8. The method of claim 7, wherein computing the one-score for each reference delay code further comprises computing a probability of a '1' sample for the reference delay code according to X/Y.

9. The method of claim 1, wherein computing the code offset time for each reference delay code comprises:
generating a pulse signal having a pulse width corresponding to the amount of delay applied by the reference delay code to the reference clock signal to generate the delayed reference clock signal;
asynchronously sampling the pulse signal at each of K cycles of a sampling clock generated asynchronously with respect to the reference clock signal, K being a predefined cycle count of a sampling window; and
computing the code offset time as a function of a total count of '1' samples ($J_N$) obtained over the sampling window, the code offset time associated with an adjacent reference delay code in the sequence ($J_{N-1}$), K, and a sampling period of the sampling clock.

10. The method of claim 1, wherein generating the RJ output comprises:
identifying a subset of the reference delay codes of the reference delay code sweep window as approximating one standard definition from the mean of the distribution; and
computing a total subset offset time as a function of the code offset times for the subset of the reference delay codes,
wherein the RJ output is computed as the total subset offset time.

11. The method of claim 10, wherein identifying the subset of the reference delay codes comprises:
determining a first reference delay code as yielding a one-score of approximately one standard deviation below the mean of the distribution; and
determining a second reference delay code as yielding a one-score of approximately one standard deviation above the mean of the distribution,
wherein the subset of the reference delay codes is identified as approximately half of the subsequence of reference delay codes between the first and second reference delay codes.

12. A system for on-chip random jitter (RJ) measurement in a clocking circuit, the system comprising:
a RJ computation module having:
a reference clock signal input;
a feedback clock signal input; and
a RJ signal output indicating a RJ measurement computed as a function of the reference clock signal input and the feedback clock signal input by:
computing a distribution of one-scores over a reference delay code sweep window by, for each of a sequence of reference delay codes of the reference delay code sweep window:
computing a one-score for the reference delay code, the one-score indicating a probability of a first clock signal and a second clock signal both being asserted at a clock transition time of the second clock signal, wherein one of the first and second clock signals is the feedback clock signal input and the other of the first and second clock signals is a delayed reference clock signal, the delayed reference clock signal being the reference clock signal input delayed by an amount corresponding to the reference delay code;
computing a code offset time for the reference delay code, the code offset time being a time increment between the reference delay code and the preceding reference delay code in the sequence; and
generating the RJ signal output as a function of the distribution.

13. The system of claim 12, wherein the RJ measurement is computed further by:

determining the reference delay code sweep window to capture at least a candidate RJ range of the feedback clock signal, such that the reference delay code sweep window comprises the sequence of reference delay codes.

14. The system of claim 13, wherein determining the reference delay code sweep window comprises:
setting the reference delay code to delay the reference clock signal to a location past the candidate RJ range at which sampling the clock feedback signal according to the delayed reference clock signal is probabilistically certain to achieve a '1' sample;
iteratively applying a coarse reduction to the reference delay code to iteratively advance the reference clock signal, sampling the clock feedback signal according to the delayed reference clock signal in each iteration, until a '0' sample is achieved;
storing the reference delay code at which the '0' sample is received as a reference anchor location;
until a number (F) of fine iterations corresponds to a predetermined offset threshold:
iteratively applying a fine increase to the reference delay code to iteratively delay the reference clock signal, sampling the clock feedback signal according to the delayed reference clock signal in each iteration, until a '1' sample is achieved after F fine iterations;
determining whether F corresponds to a predetermined offset threshold;
when F exceeds the predetermined offset threshold, adjusting a feedback delay code to advance the clock feedback signal; and
when F is less than the predetermined offset threshold, adjusting the feedback delay code to delay the clock feedback signal; and
when F corresponds to the predetermined offset threshold, storing the feedback delay code at which F corresponds to the offset threshold as a feedback anchor location,
wherein the reference delay code sweep window is defined according to the reference anchor location and the feedback anchor location.

15. The system of claim 12, further comprising:
a state machine having:
a RJ signal input coupled with the RJ signal output;
a clocking system parameter data store having a plurality of sets of clocking circuit parameters stored thereon; and
a clocking system output indicating one of the sets of clocking circuit parameters,
wherein, when the clocking system output is coupled to a clocking circuit, the clocking circuit is configured according to the one of the sets of clocking circuit parameters, and the RJ signal output indicates RJ of a clock signal output of the clocking system.

16. The system of claim 15, wherein the clocking system output comprises a selected one of the sets of clocking circuit parameters subsequent to receiving a respective RJ signal output in association with sequentially outputting each of the sets of clocking circuit parameters, such that the selected one of the sets of clocking circuit parameters is selected as being associated with a lowest respective RJ signal output.

17. The system of claim 12, further comprising:
a reference clock generator having a reference clock signal output coupled with the reference clock signal input; and
a phase-locked loop (PLL) circuit having a feedback clock signal output coupled with the feedback clock signal input.

18. The system of claim 12, wherein computing the one-score for each reference delay code comprises:
sampling the feedback clock signal input at each of Y cycles of the delayed reference clock signal, Y being a predefined cycle count of a sampling window,
the one-score corresponding to a total count of '1' samples (X) obtained over the sampling window.

19. The system of claim 12, wherein computing the code offset time for each reference delay code comprises:
generating a pulse signal having a pulse width corresponding to the amount of delay applied by the reference delay code to the reference clock signal input to generate the delayed reference clock signal;
asynchronously sampling the pulse signal at each of K cycles of a sampling clock generated asynchronously with respect to the reference clock signal input, K being a predefined cycle count of a sampling window; and
computing the code offset time as a function of a total count of '1' samples ($J_N$) obtained over the sampling window, the code offset time associated with an adjacent reference delay code in the sequence ($J_{N-1}$), K, and a sampling period of the sampling clock.

20. The system of claim 12, wherein generating the RJ output comprises:
identifying a subset of the reference delay codes of the reference delay code sweep window as approximating one standard definition from the mean of the distribution; and
computing a total subset offset time as a function of the code offset times for the subset of the reference delay codes,
wherein the RJ output is computed as the total subset offset time.

\* \* \* \* \*

UNITED STATES PATENT AND TRADEMARK OFFICE
CERTIFICATE OF CORRECTION

| | | |
|---|---|---|
| PATENT NO. | : 9,893,878 B1 | Page 1 of 1 |
| APPLICATION NO. | : 15/459715 | |
| DATED | : February 13, 2018 | |
| INVENTOR(S) | : Kong et al. | |

It is certified that error appears in the above-identified patent and that said Letters Patent is hereby corrected as shown below:

In the Drawings

On sheet 7 of 11, in FIG. 10, under Reference Numeral 1016, Line 3, delete "predertermined" and insert -- predetermined --, therefor.

On sheet 7 of 11, in FIG. 10, under Reference Numeral 1018, Line 3, delete "predertermined" and insert -- predetermined --, therefor.

Signed and Sealed this
Twenty-first Day of August, 2018

Andrei Iancu
*Director of the United States Patent and Trademark Office*